(12) United States Patent
Xue et al.

(10) Patent No.: US 11,594,182 B2
(45) Date of Patent: Feb. 28, 2023

(54) GATE DRIVER ON ARRAY (GOA) CIRCUIT, DISPLAY PANEL AND THRESHOLD VOLTAGE COMPENSATING METHOD FOR A THIN FILM TRANSISTOR

(71) Applicant: Shenzhen China Star Optoelectronics Semiconductor Display Technology Co., Ltd., Shenzhen (CN)

(72) Inventors: Yan Xue, Shenzhen (CN); Baixiang Han, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 0 days.

(21) Appl. No.: 16/646,152

(22) PCT Filed: Dec. 26, 2019

(86) PCT No.: PCT/CN2019/128662
§ 371 (c)(1),
(2) Date: Mar. 11, 2020

(87) PCT Pub. No.: WO2021/120272
PCT Pub. Date: Jun. 24, 2021

(65) Prior Publication Data
US 2022/0310019 A1    Sep. 29, 2022

(30) Foreign Application Priority Data
Dec. 18, 2019    (CN) .......................... 201911309888.6

(51) Int. Cl.
*G09G 3/3266*    (2016.01)
*G09G 3/36*    (2006.01)

(52) U.S. Cl.
CPC ......... *G09G 3/3266* (2013.01); *G09G 3/3677* (2013.01); *G09G 2300/0426* (2013.01); *G09G 2300/0852* (2013.01)

(58) Field of Classification Search
CPC .................................................... G09G 3/3266
See application file for complete search history.

(56) References Cited

U.S. PATENT DOCUMENTS

| 6,229,325 B1 | 5/2001 | Browning |
| 8,098,791 B2 | 1/2012 | Lin et al. |

(Continued)

FOREIGN PATENT DOCUMENTS

| CN | 103871362 A | 6/2014 |
| CN | 105741781 A | 7/2016 |

(Continued)

*Primary Examiner* — Sepehr Azari
(74) *Attorney, Agent, or Firm* — PV IP PC; Wei Te Chung; Ude Lu

(57) ABSTRACT

The present invention provides a gate driver on array (GOA) circuit, a display panel, and a threshold voltage compensating method for a thin film transistor (TFT). The GOA circuit only includes five TFTs and achieves a super narrow bezel of a display panel, and uses a dual-gate electrode structure as the first thin film transistor (T1). Therefore, a threshold voltage (Vth) in the GOA circuit is controlled by a top gate (the top gate connected to a node in the GOA circuit) and a bottom gate (adjustable voltage source (VLS)). Specifically, when the Vth of the TFT negatively shifts overall, the bottom gate voltage can be adjusted negatively. When the Vth of the TFT positively shifts, the bottom gate voltage can be adjusted negatively to stabilize the GOA circuit, increase a lifespan thereof, reduce leakage of a first node (Q) such that the GOA circuit can output ultra-wide pulse signals.

10 Claims, 8 Drawing Sheets

(56) References Cited

U.S. PATENT DOCUMENTS

| | | | |
|---|---|---|---|
| 9,396,679 | B2 | 7/2016 | Kong et al. |
| 9,990,883 | B2 | 6/2018 | Park et al. |
| 10,032,838 | B2 | 7/2018 | Nie |
| 10,115,341 | B2 | 10/2018 | Kong et al. |
| 2002/0053884 | A1 | 5/2002 | Kimura |
| 2015/0269879 | A1* | 9/2015 | Shang ............... G09G 3/20 345/215 |
| 2016/0225307 | A1* | 8/2016 | Yoon ............... G09G 3/3696 |
| 2017/0193949 | A1* | 7/2017 | Kim ............... G09G 3/3696 |
| 2018/0190204 | A1* | 7/2018 | Shin ............... G11C 19/28 |
| 2018/0357946 | A1 | 12/2018 | Ryu et al. |
| 2019/0251921 | A1* | 8/2019 | Ono ............... G09G 3/20 |
| 2021/0335265 | A1* | 10/2021 | Xue ............... G09G 3/3266 |

FOREIGN PATENT DOCUMENTS

| | | |
|---|---|---|
| CN | 107316614 A | 11/2017 |
| CN | 109979398 A | 7/2019 |
| CN | 110136652 A | 8/2019 |
| CN | 110148382 A | 8/2019 |
| CN | 110415648 A | 11/2019 |
| KR | 20170026971 A | 3/2017 |
| TW | 201123728 A | 7/2011 |

\* cited by examiner

GATE DRIVER ON ARRAY (GOA) CIRCUIT, DISPLAY PANEL AND THRESHOLD VOLTAGE COMPENSATING METHOD FOR A THIN FILM TRANSISTOR

FIELD OF INVENTION

The present invention relates to a field of display technologies, especially relates to a gate driver on array (GOA) circuit, a display panel, and a threshold voltage compensating method for a thin film transistor.

BACKGROUND OF INVENTION

Driving of horizontal scan lines of a conventional active matrix organic light emitting diode (AMOLED) display panel is achieved by an external integrated circuit. The external integrated circuit can control and switch on row scan lines of stages on stage by stage. By employing a gate driver on array (GOA) method, a row scan driver circuit can be integrated on a substrate of the display panel to be able to reduce a number of external integrated circuits (ICs) such that a manufacturing cost of the display panel is reduced and a narrow bezel of the display device can be achieved. Oxide thin film transistors have a high mobility and an excellent device stability, and is used extensively in GOA circuits.

SUMMARY OF INVENTION

Technical Issue

In a manufacturing process of oxide thin film transistors (TFTs), process fluctuation affects uniformity of threshold voltages of the display panel. Furthermore, the oxide thin film transistor is easily interfered by external conditions such as electric characteristics, light irradiation, and variation of temperature such that a threshold voltage of the device easily shifts. As described above, to guarantee normal work of a GOA circuit under non-uniformity or variation of the threshold voltage, lots of sub-circuits are required to be disposed in the GOA circuit. Therefore, a design of the GOA of each stage become more complicated, an amount of the TFTs is great, which disadvantages an achievement of a narrow bezel of the display panel and is inconsistent with an original intention of the narrow bezel design.

Technical Solution

To achieve the above objective, the present invention provides a gate driver on array (GOA) circuit, comprising a plurality of GOA circuit units that are cascaded, and a $n^{th}$-stage GOA circuit unit of the GOA circuit units comprising first to fifth thin film transistors (T1 to T5) and a capacitor (Cbt); wherein the first thin film transistor (T1) is a dual-gate thin film transistor, a top gate electrode of the first thin film transistor (T1) is configured to receive a first clock signal (CK1), a bottom gate electrode of the first thin film transistor (T1) is connected to an adjustable voltage source (VLS), a source electrode of the first thin film transistor (T1) is connected to a signal G(n−1) of a (n−1)$^{th}$-stage GOA circuit unit, and a drain electrode of the first thin film transistor (T1) is connected to a gate electrode of the fourth thin film transistor (T4); wherein a gate electrode of the second thin film transistor (T2) is connected to a first node (Q), a source electrode of the second thin film transistor (T2) is connected to a drain electrode of the fifth thin film transistor (T5), a drain electrode of the second thin film transistor (T2) is configured to receive a second clock signal (CK2); wherein a gate electrode of the third thin film transistor (T3) is configured to receive a high voltage source (VGH), a drain electrode of the third thin film transistor (T3) is configured to receive a high voltage source (VGH), a source electrode of the third thin film transistor (T3) is connected to a drain electrode of the fourth thin film transistor (T4); wherein a source electrode of the fourth thin film transistor (T4) is configured to receive a low voltage source (VGL); wherein a gate electrode of the fifth thin film transistor (T5) is connected to a second node (QB), a source electrode of the fifth thin film transistor (T5) is configured to receive the low voltage source (VGL); wherein an end of the capacitor (Cbt) is connected to the first node (Q), and another end of the capacitor (Cbt) is connected to an output signal G(n) of the $n^{th}$-stage GOA circuit unit.

Furthermore, a duty ratio of the first clock signal (CK1) is 0.5 and is a rectangular wave.

Furthermore, the first to fifth thin film transistors (T1 to T5) are indium gallium zinc oxide thin film transistors; and/or the GOA circuit is a GOA circuit of an organic light emitting diode (OLED) display panel; and/or the GOA circuit is a GOA circuit of liquid crystal display (LCD) panel.

Furthermore, the output signal G(n) of the $n^{th}$-stage GOA circuit unit serves as a stage transfer signal inputted to a next stage GOA circuit unit.

The present invention also provides a display panel, comprising a displaying region and a non-displaying region, the non-displaying region comprising: the GOA circuit as described above, the GOA circuit disposed near left and right sides of the displaying region; a feedback compensation system disposed on upper and lower sides of the displaying region, the feedback compensation system connected a chip on film package; wherein the feedback compensation system is configured to detect an electrical characteristic of the first thin film transistor (T1) in the GOA circuit and adjust a bottom gate voltage of the first thin film transistor (T1) according to variation of the electrical characteristic to recover the electrical characteristic of the first thin film transistor (T1); and a bus signal disposed on a side of the GOA circuit away from the displaying region, and connected to the feedback compensation system.

Furthermore, the feedback compensation system comprises a mirror circuit and a control module; the mirror circuit comprises some of elements of the GOA circuit as follows: the first thin film transistor (T1), the top gate electrode of the first thin film transistor (T1) connected to the first clock signal (CK1) or a data signal (Data), the bottom gate electrode of the first thin film transistor (T1) configured to receive an adjustable voltage source (VLS), the source electrode of the first thin film transistor (T1) connected to the high voltage source (VGH) or a scan signal (STV), and the drain electrode of the first thin film transistor (T1) connected to the first node (Q); the gate electrode of the second thin film transistor (T2) connected to the first node (Q), the source electrode of the second thin film transistor (T2) connected to one end of the capacitor (Cbt), the drain electrode of the second thin film transistor (T2) configured to receive the second clock signal (CK2) or the low voltage source (VGL); the other end of the second capacitor (Cbt) connected to the first node (Q); and a sixth thin film transistor (T6), a gate electrode of the sixth thin film transistor (T6) connected to the high voltage source (VGH) or the low voltage source (VGL), a drain electrode of the sixth thin film transistor (T6) configured to receive a sense line of the control module, and a source electrode of the sixth thin film transistor (T6) connected to the first node (Q); and the control module is integrated in a driver integrated circuit (IC) in the chip on film package.

Furthermore, the first clock signal (CK1), the second clock signal (CK2), and the scan signal (STV) are provided by an external timing controller.

Furthermore, the first clock signal (CK1), the second clock signal (CK2), and the scan signal (STV) are combined, and correspond to a power-on status and a power-off status sequentially; each of the power-on status and the power-off status comprises a stage S1 to a stage S3; under the power-on status, a work status of the GOA circuit corresponds to the stage S1 to the stage S3: in the stage S1, the first clock signal (CK1) and the signal G(n−1) of the (n−1)$^{th}$-stage GOA circuit unit are in a high potential, the first thin film transistor (T1), the second thin film transistor (T2), and the fourth thin film transistor (T4) are switched on; in the stage S2, the first clock signal (CK1) and the signal G(n−1) of the (n−1)$^{th}$-stage GOA circuit unit are in a low potential, the first thin film transistor (T1) is switched off, and the second clock signal (CK2) increases from a low potential to a high potential; in the stage S3, the first clock signal (CK1) and the signal G(n−1) of the (n−1)$^{th}$-stage GOA circuit unit are in a low potential, the first thin film transistor (T1) is kept switched off, the second clock signal (CK2) decreases from a high potential to a low potential, and the second thin film transistor (T2) is switched on; under the power-on status, in the feedback compensation system, the top gate electrode of the first thin film transistor (T1) is connected to a first clock signal (CK1), the source electrode of the first thin film transistor (T1) is connected to the scan signal (STV), the drain electrode of the second thin film transistor (T2) is configured to receive a second clock signal (CK2), a gate electrode of the sixth thin film transistor (T6) is connected to the low voltage source (VGL); and a work status of the feedback compensation system corresponds to the stage S1 to the stage S3 as follows: in the stage S1, the first clock signal (CK1) and the scan signal (STV) are in a high potential, and the first thin film transistor (T1) and the second thin film transistor (T2) is switched on; in the stage S2, the first clock signal (CK1) and the scan signal (STV) are in a low potential, the first thin film transistor (T1) is switched off, and the second clock signal (CK2) increases from a low potential to a high potential; and in the stage S3, the first clock signal (CK1) is in a low potential, and the first thin film transistor (T1) is switched off.

Furthermore, under the power-off status, in the feedback compensation system, the top gate electrode of the first thin film transistor (T1) is connected to the data signal (Data), the source electrode of the first thin film transistor (T1) is connected to the high voltage source (VGH), the drain electrode of the second thin film transistor (T2) is configured to receive the low voltage source (VGL), the gate electrode of the sixth thin film transistor (T6) is connected to the high voltage source (VGH), and the sixth thin film transistor (T6) is switched on.

The present invention also provides a threshold voltage compensating method for a thin film transistor, comprising: providing the display panel as described above; entering a power-on status of a combination of the first clock signal (CK1), the second clock signal (CK2), and the scan signal (STV), wherein under the power-on status, a work status of the GOA circuit corresponds to the stage S1 to the stage S3: entering the stage S1, wherein the first clock signal (CK1) and the signal G(n−1) of the (n−1)$^{th}$-stage GOA circuit unit increase to a high potential, the first thin film transistor (T1) is switched on, the first node (Q) increases to a high potential, a storage capacitor (Cst) starts to charge, the second thin film transistor (T2) and the fourth thin film transistor (T4) are switched on, a width and a length of the fourth thin film transistor (T4) is far greater than those of the third thin film transistor (T3), the second node (QB) outputs a low potential, the output signal G(n) of the n$^{th}$-stage GOA circuit unit outputs a low potential; entering the stage S2, wherein the first clock signal (CK1) and the signal G(n−1) of the (n−1)$^{th}$-stage GOA circuit unit is in a low potential, the first thin film transistor (T1) is switched off, the second clock signal (CK2) increases from a low potential to a high potential, and the output signal G(n) of the n$^{th}$-stage GOA circuit unit increases a high potential; entering the stage S3, the first clock signal (CK1) and the signal G(n−1) of the (n−1)$^{th}$-stage GOA circuit unit are in a low potential, the first thin film transistor (T1) is kept switched off, the second clock signal (CK2) decreases from a high potential to a low potential, the second thin film transistor (T2) is switched on, the output signal G(n) of the n$^{th}$-stage GOA circuit unit decreases to a low potential, and the first node (Q) is coupled to a high potential; under the power-on status, adjusting a connection status of the feedback compensation system, wherein the top gate electrode of the first thin film transistor (T1) is connected to a first clock signal (CK1), the source electrode of the first thin film transistor (T1) is connected to the scan signal (STV), the drain electrode of the second thin film transistor (T2) is configured to receive a second clock signal (CK2), and a gate electrode of the sixth thin film transistor (T6) is connected to the low voltage source (VGL); adjusting an electrical characteristic of the feedback compensation system such that voltages of four ends of the first thin film transistor (T1) in the feedback compensation system are consistent with voltages of four ends of the first thin film transistor (T1) in the GOA circuit, wherein the step of adjusting are the stage S1 to the stage S3 as follows: entering the stage S1, wherein the first clock signal (CK1) and the scan signal (STV) are in a high potential, the first thin film transistor (T1) and the second thin film transistor (T2) are switched on, the first node (Q) increases to a high potential, the storage capacitor (Cst) starts to charge; entering the stage S2, wherein the first clock signal (CK1) and the scan signal (STV) are in a low potential, the first thin film transistor (T1) is switched off, the second clock signal (CK2) increases from a low potential to a high potential, the storage capacitor (Cst) starts to discharge, and the first node (Q) potential is coupled to a higher potential; entering the stage S3, wherein the first clock signal (CK1) is a low potential, the first thin film transistor (T1) is switched off, a potential of the first node (Q) is coupled to a high potential; entering a power-off status, adjusting the connection status of the feedback compensation system, wherein the top gate electrode of the first thin film transistor (T1) is connected to the data signal (Data), the source electrode of the first thin film transistor (T1) is connected to the high voltage source (VGH), the drain electrode of the second thin film transistor (T2) is connected to the low voltage source (VGL), and the gate electrode of the sixth thin film transistor (T6) is connected to the high voltage source (VGH); detecting a sense line potential in the feedback compensation system by a control module, wherein the sense line potential is Vdata-Vth, Vdata indicates a voltage of the data signal (Data), Vth indicates a threshold voltage of the first thin film transistor (T1); and adjusting the bottom gate voltage of the first thin film transistor (T1) for compensation of the Vth by using a shift value detected by the control module during a next booting of the display panel.

Advantages

The present invention provides a gate driver on array (GOA) circuit, a display panel, and a threshold voltage compensating method for a thin film transistor (TFT). The GOA circuit only includes five TFTs and can achieve a super narrow bezel of a display panel, and uses a dual-gate electrode structure as the first thin film transistor (T1). Therefore, a threshold voltage (Vth) in the GOA circuit is controlled by a top gate (the top gate connected to a node in the GOA) and a bottom gate (adjustable voltage source (VLS)). Specifically, when the Vth of the TFT negatively shifts, the bottom gate voltage can be adjusted negatively. When the Vth of the TFT positively shifts, the bottom gate voltage can be adjusted negatively to stabilize the GOA circuit, increase a lifespan thereof, reduce leakage of a first node (Q) such that the GOA circuit can output ultra-wide pulse signals.

DETAILED DESCRIPTION OF PREFERRED EMBODIMENTS

The present invention provides a gate driver on array (GOA) circuit, a display panel, and a threshold voltage compensating method for a thin film transistor. To make the objective, the technical solution, and the effect of the present invention clearer and more explicit, the present invention will be further described in detail below with reference to the accompanying drawings. It should be understood that the specific embodiments described here are only used to explain the present invention instead of being used to limit the present invention.

Figure 1:
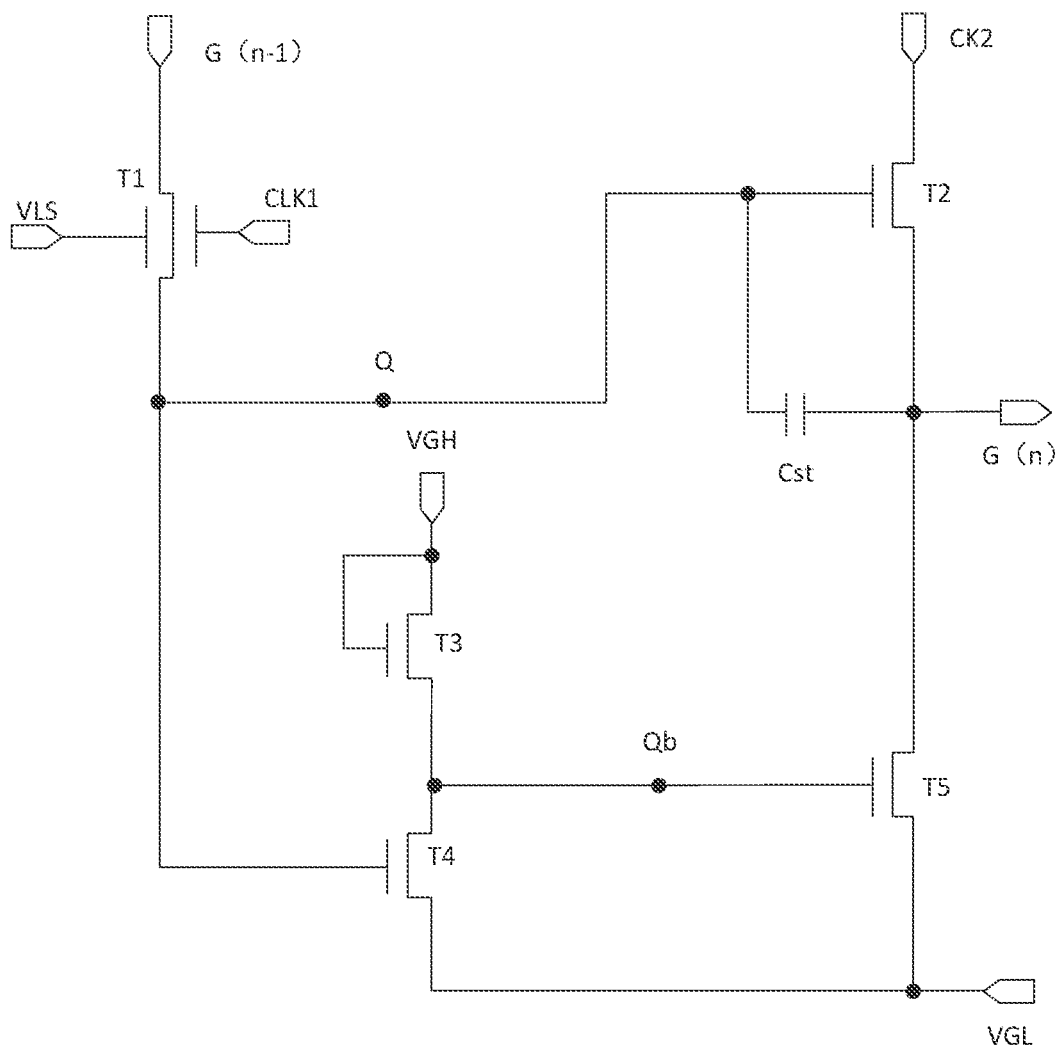
FIG. 1 is a circuit diagram of a GOA circuit provided by the present invention.

With reference to FIG. 1, the present invention provides a gate driver on array (GOA) circuit comprising a plurality of GOA circuit units that are cascaded, and a $n^{th}$-stage GOA circuit unit of the GOA circuit units comprises: first to fifth thin film transistors (T1 to T5), capacitor (Cbt).

The first thin film transistor (T1) is a dual-gate thin film transistor. A top gate electrode of the first thin film transistor (T1) is configured to receive a first clock signal (CK1). A bottom gate electrode of the first thin film transistor (T1) is connected to an adjustable voltage source (VLS). A source electrode of the first thin film transistor (T1) is connected to a signal G(n−1) of the $(n-1)^{th}$-stage GOA circuit unit. A drain electrode of the first thin film transistor (T1) is connected to a gate electrode of the fourth thin film transistor (T4).

Figure 2:
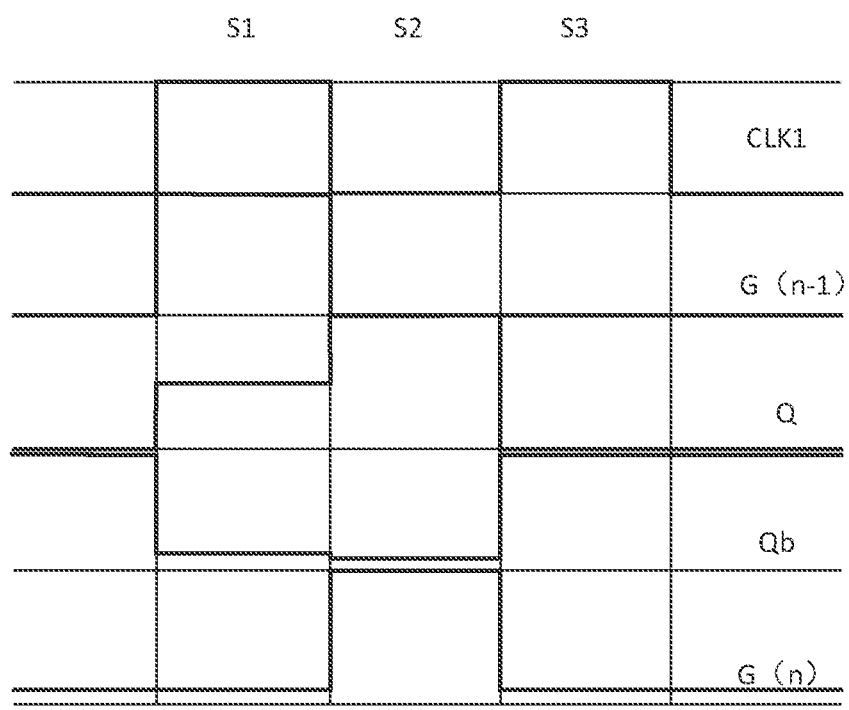
FIG. 2 is a timing diagram of the GOA circuit provided by the present invention.

With reference to FIG. 2, a duty ratio of the first clock signal (CK1) is 0.5 and is a rectangular wave.

A gate electrode of the second thin film transistor (T2) is connected to a first node (Q), a source electrode of the second thin film transistor (T2) is connected to a drain electrode of the fifth thin film transistor (T5), a drain electrode of the second thin film transistor (T2) is configured to receive a second clock signal (CK2).

A gate electrode of the third thin film transistor (T3) is configured to receive a high voltage source (VGH), a drain electrode of the third thin film transistor (T3) is configured to receive a high voltage source (VGH), a source electrode of the third thin film transistor (T3) is connected to a drain electrode of the fourth thin film transistor (T4).

A source electrode of the fourth thin film transistor (T4) is configured to receive a low voltage source (VGL).

A gate electrode of the fifth thin film transistor (T5) is connected to a second node (Qb), a source electrode of the fifth thin film transistor (T5) is configured to receive the low voltage source (VGL).

An end of the capacitor (Cbt) is connected to the first node (Q), and another end of the capacitor (Cbt) is connected to an output signal G(n) of the $n^{th}$-stage GOA circuit unit. The output signal G(n) of the $n^{th}$-stage GOA circuit unit serves as a stage transfer signal inputted to a next stage GOA circuit unit.

The first to fifth thin film transistors (T1 to T5) are indium gallium zinc oxide thin film transistors; and/or the GOA circuit is a GOA circuit of an organic light emitting diode (OLED) display panel; and/or the GOA circuit is a GOA circuit of liquid crystal display (LCD) panel.

the present invention provides a GOA circuit, a threshold voltage (Vth) of the first thin film transistor (T1) are controlled by both a top gate (the top gate connected to a node in the GOA circuit), and a bottom gate (control of an adjustable potential). During work of the GOA circuit, the bottom gate can achieve a controllable Vth of the first thin film transistor (T1) and further achieve an adjustable Vth of the first thin film transistor (T1) in the GOA circuit.

Figure 3:
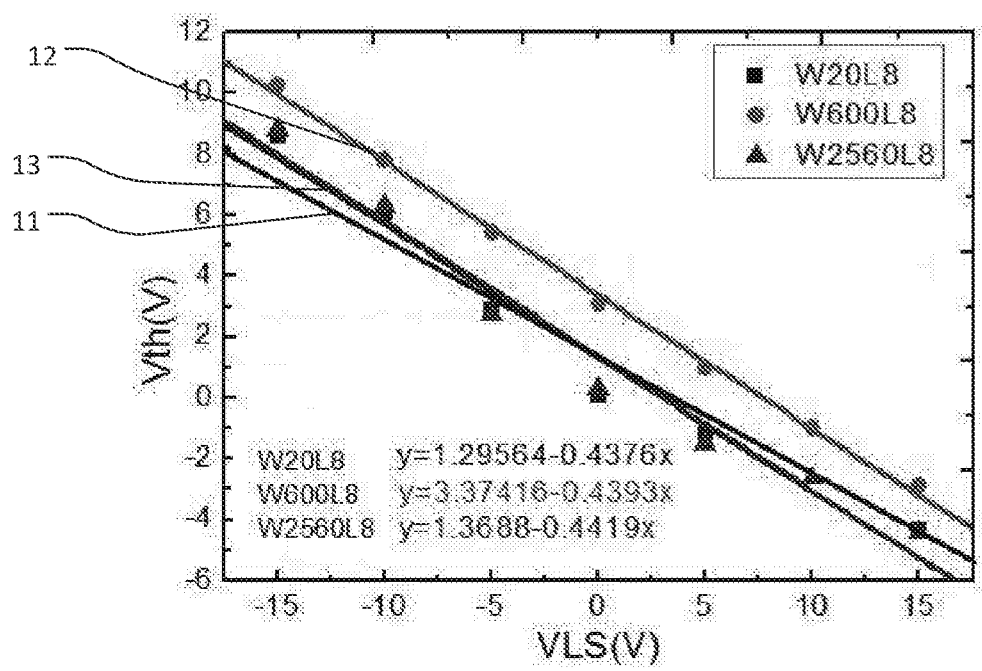
FIG. 3 is a relationship linear chart of adjustment of a bottom voltage and a threshold voltage of a different dual-gate electrode thin film transistor provided by the present invention.

After adjustment of experiment data, the present invention can control Vth of the bottom gate voltage of the first thin film transistor (T1), as shown in FIG. 3 (bottom gate voltage VLS). It is indicated from FIG. 3 that the bottom gate voltage is inversely proportional to the threshold voltage.

The GOA circuit is a GOA circuit of an organic light emitting diode (OLED) display panel; and/or, the GOA circuit is a GOA circuit of a liquid crystal display (LCD) panel.

In FIG. 3, three types of thin film transistors are adjusted, W20L8 (marked with reference character 11), W600L8 (marked with reference character 12), and W2560L8 (marked with reference character 13) are made with fitting curvatures. Indication of the present invention is not only for the three sizes.

After a backplate is produced, power-off timing detection is implemented, when the Vth of the first thin film transistor (T1) negatively shifts overall, the bottom gate voltage can be adjusted positive. When the Vth of the first thin film transistor (T1) positively shifts, the bottom gate voltage can be adjusted negatively to achieve a controllable electrical characteristic.

Figure 4:
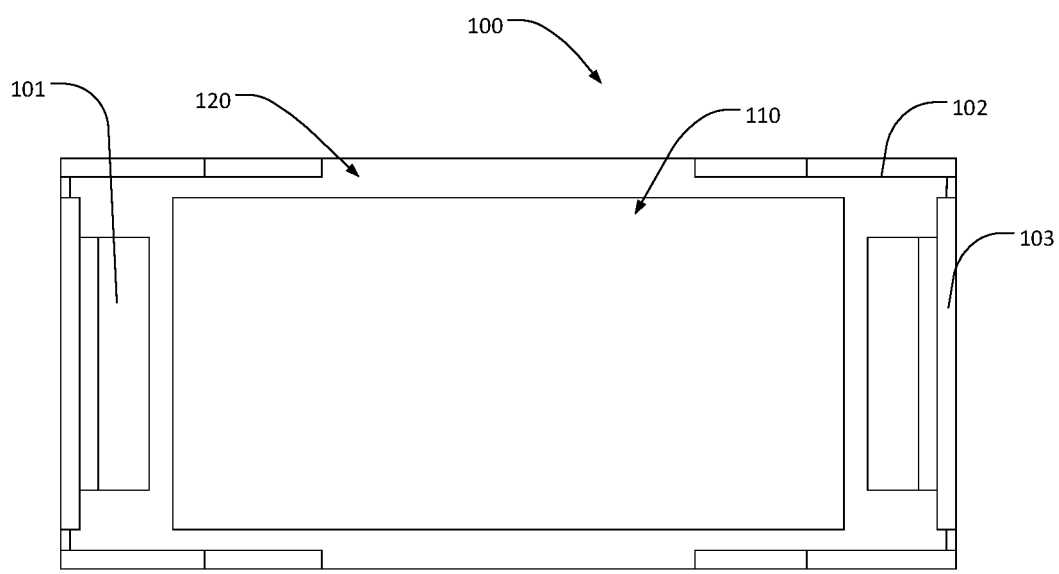
FIG. 4 is a planar view of the display panel provided by the present invention.

With reference to FIG. 4, the present invention provides a display panel 110 comprising a displaying region 110 and a non-displaying region 120, and the display panel 110 is a display panel with a super narrow bezel.

The non-displaying region 120 comprises: the GOA circuit 101, a feedback compensation system 102, and a bus signal 103.

The GOA circuit 101 of each stage comprises fives TFTs, which can reduce a space of the GOA to achieve a narrow bezel.

Figure 5:
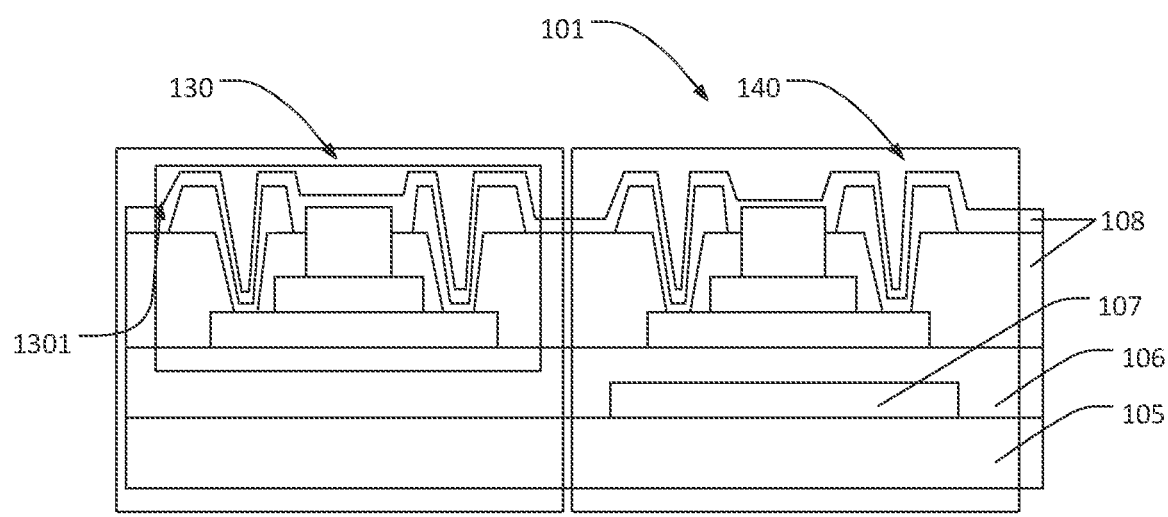
FIG. 5 is a partial cross-sectional view of a region of a GOA circuit provided in FIG. 4.

With reference to FIG. 5, FIG. 5 is a partial cross-sectional view of a region of the GOA circuit, and a specific structure comprises: a substrate 105, a buffer layer 106, and a dielectric layer 108.

The substrate 105 comprises a single gate region 130 and a dual-gate region 140. A thin film transistor 1301 is disposed in the dielectric layer 108, the thin film transistor 1301 is a single gate structure.

The dual-gate region also comprises thin film transistor devices of the single gate region, and further comprises a bottom gate electrode 107 disposed in the buffer layer 106. The thin film transistor 1301 of the single gate structure is a P-type thin film transistor or a N-type thin film transistor.

With further reference to FIG. 4, the GOA circuit 101 is disposed left and right sides of the displaying region 110.

The feedback compensation system 102 is disposed on upper and lower sides of the displaying region 110. The feedback compensation system 102 is connected to a chip on film package. The feedback compensation system 102 is configured to detect an electrical characteristic of the first thin film transistor (T1) in the GOA circuit and adjust a bottom gate voltage of the first thin film transistor (T1) according to variation of the electrical characteristic to recover the electrical characteristic of the first thin film transistor (T1).

The bus signal 103 is disposed on a side of the GOA circuit 101 away from the displaying region 110, and the feedback compensation system 102 is connected to the bus signal 103.

Figure 6:
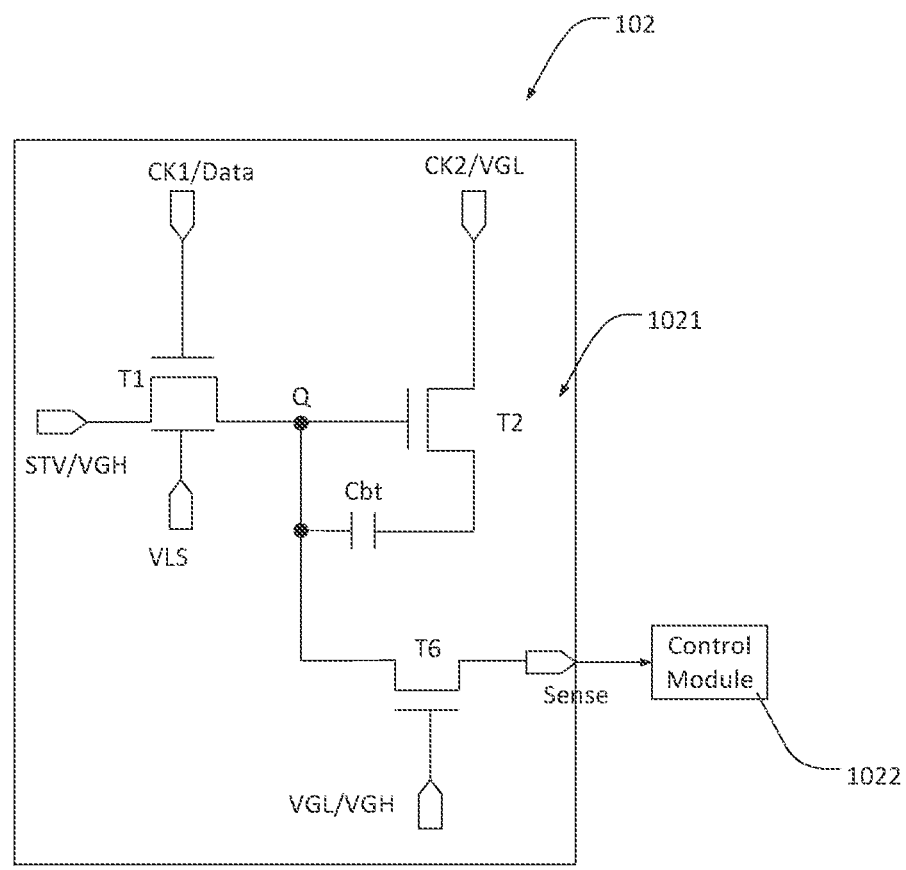
FIG. 6 is a functional module diagram of a feedback compensation system provided in FIG. 4.

With reference to FIG. 6, the feedback compensation system 103 comprises a mirror circuit 1021 and a control module 1022.

The mirror circuit 1021 comprises some of elements of the GOA circuit 101, and is configured to detect the electrical characteristic of the first thin film transistor (T1) under the power-off status. Because a dimension of the first thin film transistor (T1) of the mirror circuit is consistent with a dimension of the first thin film transistor (T1) in the GOA circuit. By adjustment of stages potentials connected to four ends can be consistent, and an electrical characteristic of the first thin film transistor (T1) of the feedback compensation system can be mirrored successfully into the first thin film transistor (T1) in the GOA circuit, the mirror circuit specifically comprises:

the first thin film transistor (T1), the top gate electrode of the first thin film transistor (T1) connected to the first clock signal (CK1) or a data signal (Data), the bottom gate electrode of the first thin film transistor (T1) configured to receive an adjustable voltage source (VLS), the source electrode of the first thin film transistor (T1) connected to the high voltage source (VGH) or a scan signal (STV), and the drain electrode of the first thin film transistor (T1) connected to the first node (Q);

the gate electrode of the second thin film transistor (T2) connected to the first node (Q), the source electrode of the second thin film transistor (T2) connected to one end of the capacitor (Cbt), the drain electrode of the second thin film transistor (T2) configured to receive the second clock signal (CK2) or the low voltage source (VGL).

the other end of the second capacitor (Cbt) connected to the first node (Q); and a sixth thin film transistor (T6), a gate electrode of the sixth thin film transistor (T6) connected to the high voltage source (VGH) or the low voltage source (VGL), a drain electrode of the sixth thin film transistor (T6) configured to receive a sense line of the control module, and a source electrode of the sixth thin film transistor (T6) connected to the first node (Q).

The control module integrated in a driver integrated circuit (IC) in the chip on film package.

The first clock signal (CK1), the second clock signal (CK2), and the scan signal (STV) are provided by an external timing controller.

The first clock signal (CK1), the second clock signal (CK2), and the scan signal (STV) are combined, and correspond to a power-on status and a power-off status sequentially.

Each of the power-on status and the power-off status comprises a stage S1 to a stage S3.

With reference to FIG. 2, under the power-on status, the GOA circuit work status corresponds to the stage S1 to the stage S3.

In the stage S1, the first clock signal (CK1) and the signal G(n−1) of the (n−1)$^{th}$-stage GOA circuit unit are in a high potential, the first thin film transistor (T1), the second thin film transistor (T2), and the fourth thin film transistor (T4) are switched on.

In the stage S2, the first clock signal (CK1) and the signal G(n−1) of the (n−1)$^{th}$-stage GOA circuit unit are in a low potential, the first thin film transistor (T1) is switched off, and the second clock signal (CK2) increases from a low potential to a high potential.

In the stage S3, the first clock signal (CK1) and the signal G(n−1) of the (n−1)$^{th}$-stage GOA circuit unit are in a low potential, the first thin film transistor (T1) is kept switched off, the second clock signal (CK2) decreases from a high potential to a low potential, and the second thin film transistor (T2) is switched on.

Under the power-on status, in the feedback compensation system, the top gate electrode of the first thin film transistor (T1) is connected to a first clock signal (CK1), the source electrode of the first thin film transistor (T1) is connected to the scan signal (STV), the drain electrode of the second thin film transistor (T2) is configured to receive a second clock signal (CK2), a gate electrode of the sixth thin film transistor (T6) is connected to the low voltage source (VGL).

Figure 7:
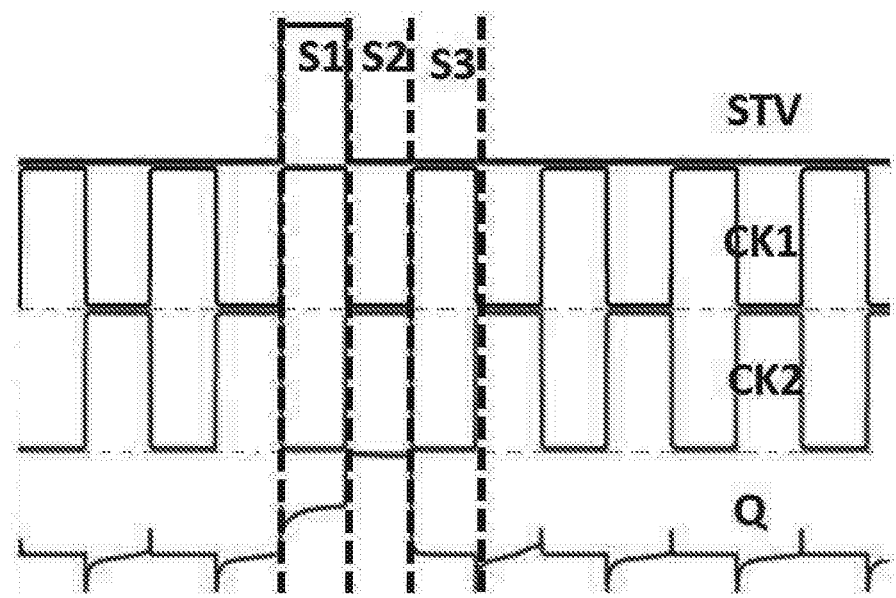
FIG. 7 is a timing diagram provided by FIG. 6.

With reference to FIG. 7, a work status of the feedback compensation system corresponds to the stage S1 to the stage S3 as follows.

In the stage S1, the first clock signal (CK1) and the scan signal (STV) are in a high potential, and the first thin film transistor (T1) and the second thin film transistor (T2) is switched on.

In the stage S2, the first clock signal (CK1) and the scan signal (STV) are in a low potential, the first thin film transistor (T1) is switched off, and the second clock signal (CK2) increases from a low potential to a high potential;

In the stage S3, the first clock signal (CK1) is in a low potential, and the first thin film transistor (T1) is switched off.

Under the power-off status, in the feedback compensation system, the top gate electrode of the first thin film transistor (T1) is connected to the data signal (Data), the source electrode of the first thin film transistor (T1) is connected to the high voltage source (VGH), the drain electrode of the second thin film transistor (T2) is configured to receive the low voltage source (VGL), the gate electrode of the sixth thin film transistor (T6) is connected to the high voltage source (VGH). In the meantime, a data of the feedback compensation system is in a low potential, and the display panel would not be turned on.

The sixth thin film transistor (T6) is switched on, a sense line (Sense) potential becomes Vdata-Vth. When the Vth of the first thin film transistor (T1) shifts, the sense line signal detects variation of the potential.

Figure 8:
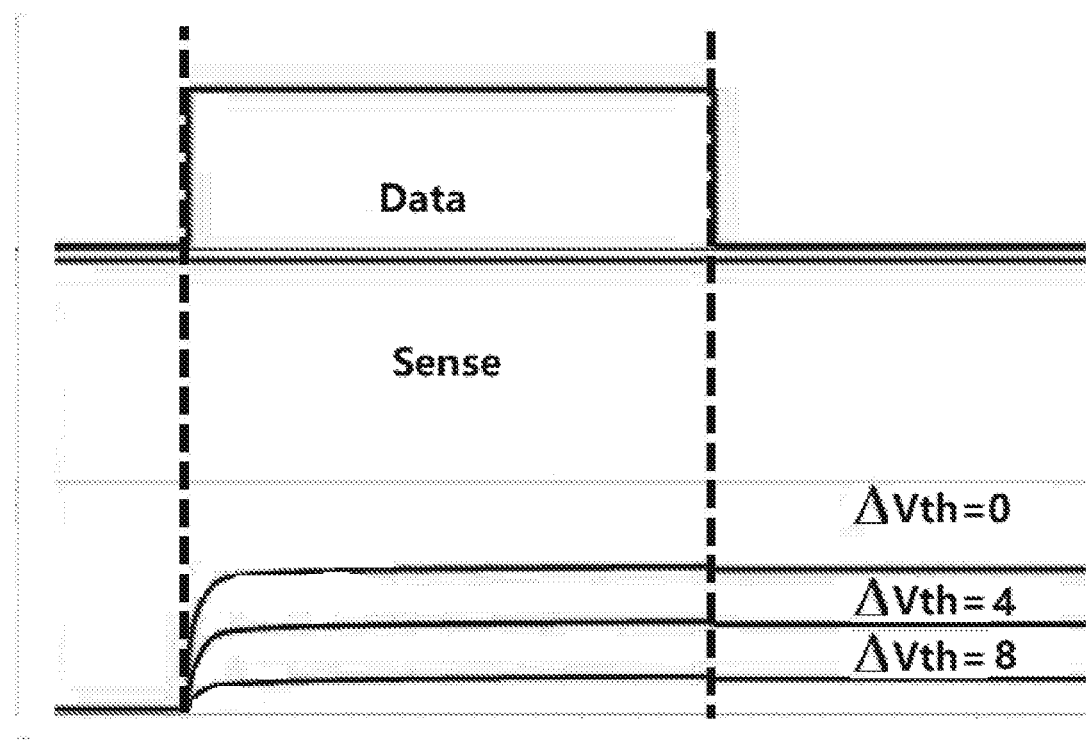
FIG. 8 is a variation simulation chart of different shift values of the threshold voltage under a power-off status in FIG. 6.

With reference to FIG. 8, an experiment simulates variations of detected voltages under conditions of zero shift of the Vth of the first thin film transistor (T1), a positive shift of 4V thereof, and a positive shift of 8V thereof.

When the Vth has a shift of 0V, a detected potential is 10.3V. When the Vth has a positive shift of 4V, the detected potential is 6.3V. When the Vth has a positive shift of 8V, the detected potential is 2.3V.

It is known that a voltage of data signal (data) is 10V, an initial Vth is −0.3V, and therefore the Vth of the first thin film transistor (T1) has a shift of 8V. it is indicated that the feedback circuit and precisely detect the Vth of the first thin film transistor (T1) under the power-off status. Furthermore, by a simulation it is calculated out that when the Vth is adjusted back to −0.3V, a corresponding bottom gate voltage of the TFT undergoes a digital to analog conversion and an analog to digital conversion by a control module. During a next booting, the VLS voltage signal of the bottom gate is adjusted such that the Vth of the TFT in the GOA circuit is compensated.

Furthermore, the display panel of the present invention, before the display panel leaves a factory, undergoes a power-off process, and can detect variation of the Vth of the TFT of the display panel. Furthermore, according to the variation of the electrical characteristic, the bottom gate voltage is adjusted smart such that the electrical characteristic of the TFT is recovered to increase a lifespan of the GOA circuit. Moreover, the feedback compensation system and GOA circuit share the bus signal without additional a signal source. The control module of the feedback compensation system can exit in the driver IC, and the sense line extends out from the driver IC to connect with the feedback compensation system without any additional cost.

A threshold voltage compensating method for a thin film transistor of the present invention comprises steps S1) to S7) as follows.

The step S1) comprises providing the display panel.

The step S2) comprises entering a power-on status of a combination of the first clock signal (CK1), the second clock signal (CK2), and the scan signal (STV), wherein under the power-on status, a work status of the GOA circuit corresponds to the stage S1 to the stage S3: entering the stage S1, wherein the first clock signal (CK1) and the signal G(n−1) of the (n−1)$^{th}$-stage GOA circuit unit increase to a high potential, the first thin film transistor (T1) is switched on, the first node (Q) increases to a high potential, a storage capacitor (Cst) starts to charge, the second thin film transistor (T2) and the fourth thin film transistor (T4) are switched on, a width and a length of the fourth thin film transistor (T4) is far greater than those of the third thin film transistor (T3), the second node (QB) outputs a low potential, the output signal G(n) of the n$^{th}$-stage GOA circuit unit outputs a low potential; entering the stage S2, wherein the first clock signal (CK1) and the signal G(n−1) of the (n−1)$^{th}$-stage GOA circuit unit is in a low potential, the first thin film transistor (T1) is switched off, the second clock signal (CK2) increases from a low potential to a high potential, and the output signal G(n) of the n$^{th}$-stage GOA circuit unit increases a high potential; entering the stage S3, the first clock signal (CK1) and the signal G(n−1) of the (n−1)$^{th}$-stage GOA circuit unit are in a low potential, the first thin film transistor (T1) is kept switched off, the second clock signal (CK2) decreases from a high potential to a low potential, the second thin film transistor (T2) is switched on, the output signal G(n) of the n$^{th}$-stage GOA circuit unit decreases to a low potential, and the first node (Q) is coupled to a high potential The step S3) comprises under the power-on status, adjusting a connection status of the feedback compensation system, wherein the top gate electrode of the first thin film transistor (T1) is connected to a first clock signal (CK1), the source electrode of the first thin film transistor (T1) is connected to the scan signal (STV), the drain electrode of the second thin film transistor (T2) is configured to receive a second clock signal (CK2), and a gate electrode of the sixth thin film transistor (T6) is connected to the low voltage source (VGL).

The step S4) comprises adjusting an electrical characteristic of the feedback compensation system such that voltages of four ends of the first thin film transistor (T1) in the feedback compensation system are consistent with voltages of four ends of the first thin film transistor (T1) in the GOA circuit, wherein the step of adjusting are the stage S1 to the stage S3 as follows: entering the stage S1, wherein the first clock signal (CK1) and the scan signal (STV) are in a high potential, the first thin film transistor (T1) and the second thin film transistor (T2) are switched on, the first node (Q) increases to a high potential, the storage capacitor (Cst) starts to charge; entering the stage S2, wherein the first clock signal (CK1) and the scan signal (STV) are in a low potential, the first thin film transistor (T1) is switched off, the second clock signal (CK2) increases from a low potential to a high potential, the storage capacitor (Cst) starts to discharge, and the first node (Q) potential is coupled to a higher potential; entering the stage S3, wherein the first clock signal (CK1) is a low potential, the first thin film transistor (T1) is switched off, a potential of the first node (Q) is coupled to a high potential;

The step S5) comprises entering a power-off status, adjusting the connection status of the feedback compensation system, wherein the top gate electrode of the first thin film transistor (T1) is connected to the data signal (Data), the source electrode of the first thin film transistor (T1) is connected to the high voltage source (VGH), the drain electrode of the second thin film transistor (T2) is connected to the low voltage source (VGL), and the gate electrode of the sixth thin film transistor (T6) is connected to the high voltage source (VGH).

The step S6) comprises detecting a sense line potential in the feedback compensation system by a control module, wherein the sense line potential is Vdata-Vth, Vdata indicates a voltage of the data signal (Data), Vth indicates a threshold voltage of the first thin film transistor (T1).

The step S7) comprises adjusting the bottom gate voltage of the first thin film transistor (T1) for compensation of the Vth by using a shift value detected by the control module during a next booting of the display panel. When the Vth negatively shifts overall, the bottom gate voltage can be adjusted negatively. When the Vth of the TFT positively shifts, the bottom gate voltage can be adjusted negatively.

Therefore, leakage of the first node (Q) is reduced such that the GOA circuit can output an ultra-wide pulse signal.

The present invention provides a gate driver on array (GOA) circuit, a display panel, and a threshold voltage compensating method for a thin film transistor (TFT). The GOA circuit only includes five TFTs and can achieve a super narrow bezel of a display panel, and uses a dual-gate electrode structure as the first thin film transistor (T1). Therefore, a threshold voltage (Vth) in the GOA circuit is controlled by a top gate (the top gate connected to a node in the GOA) and a bottom gate (adjustable voltage source (VLS)). Specifically, when the Vth of the TFT negatively shifts overall, the bottom gate voltage can be adjusted negatively. When the Vth of the TFT positively shifts, the bottom gate voltage can be adjusted negatively to stabilize the GOA circuit, increase a lifespan thereof, reduce leakage of a first node (Q) such that the GOA circuit can output ultra-wide pulse signals.

The display panel provided by the present invention is disposed with the feedback compensation system, the feedback compensation system comprises a mirror circuit and a control module. The mirror circuit is configured to detect an electrical characteristic of the first thin film transistor (T1) under the power-off status. Because a dimension of the first thin film transistor (T1) of the mirror circuit is consistent with a dimension of the first thin film transistor (T1) of the GOA circuit, by stage-adjustment the potentials of the four connected ends can be consistent, the electrical characteristic of the first thin film transistor (T1) of the feedback compensation system T1 can be successfully mirrored into the first thin film transistor (T1) of the GOA circuit such that adjustment of the bottom gate voltage can be implemented by the control module during a next booting.

Furthermore, the control module of the present invention is integrated on the driver IC, a detecting line is individually inserted from the driver IC, and can achieve compensation without additional external compensating circuit, which has no additional cost.

It can be understood that for a person of ordinary skill in the art, equivalent replacements or changes can be made according to the technical solution of the present invention and its inventive concept, and all these changes or replacements should belong to the scope of protection of the appended claims of the present invention.

What is claimed is:

1. A gate driver on array (GOA) circuit, comprising a plurality of GOA circuit units that are cascaded, and a $n^{th}$-stage GOA circuit unit of the GOA circuit units comprising first to fifth thin film transistors (T1 to T5) and a capacitor (Cbt);
   wherein the first thin film transistor (T1) is a dual-gate thin film transistor, a top gate electrode of the first thin film transistor (T1) is configured to receive a first clock signal (CK1), a bottom gate electrode of the first thin film transistor (T1) is connected to an adjustable voltage source (VLS), a source electrode of the first thin film transistor (T1) is connected to a signal G(n−1) of a (n−1)$^{th}$-stage GOA circuit unit, and a drain electrode of the first thin film transistor (T1) is connected to a gate electrode of the fourth thin film transistor (T4);
   wherein a gate electrode of the second thin film transistor (T2) is connected to a first node (Q), a source electrode of the second thin film transistor (T2) is connected to a drain electrode of the fifth thin film transistor (T5), a drain electrode of the second thin film transistor (T2) is configured to receive a second clock signal (CK2);
   wherein a gate electrode of the third thin film transistor (T3) is configured to receive a high voltage source (VGH), a drain electrode of the third thin film transistor (T3) is configured to receive the high voltage source (VGH), a source electrode of the third thin film transistor (T3) is connected to a drain electrode of the fourth thin film transistor (T4);
   wherein a source electrode of the fourth thin film transistor (T4) is configured to receive a low voltage source (VGL);
   wherein a gate electrode of the fifth thin film transistor (T5) is connected to a second node (QB), a source electrode of the fifth thin film transistor (T5) is configured to receive the low voltage source (VGL);
   wherein an end of the capacitor (Cbt) is connected to the first node (Q), and another end of the capacitor (Cbt) is connected to an output signal G(n) of the $n^{th}$-stage GOA circuit unit.

2. The GOA circuit as claimed in claim 1, wherein a duty ratio of the first clock signal (CK1) is 0.5 and is a rectangular wave.

3. The GOA circuit as claimed in claim 1, wherein the first to fifth thin film transistors (T1 to T5) are indium gallium zinc oxide thin film transistors; and/or
   the GOA circuit is a GOA circuit of an organic light emitting diode (OLED) display panel; and/or
   the GOA circuit is a GOA circuit of liquid crystal display (LCD) panel.

4. The GOA circuit as claimed in claim 1, wherein the output signal G(n) of the $n^{th}$-stage GOA circuit unit serves as a stage transfer signal inputted to a next stage GOA circuit unit.

5. A display panel, comprising a displaying region and a non-displaying region, the non-displaying region comprising: a gate driver on array (GOA) circuit, the GOA circuit disposed near left and right sides of the displaying region, and the GOA circuit comprising a plurality of GOA circuit units that are cascaded, wherein $n^{th}$-stage GOA circuit unit comprises first to fifth thin film transistors (T1 to T5) and a capacitor (Cbt); wherein the first thin film transistor (T1) is a dual-gate thin film transistor, a top gate electrode of the first thin film transistor (T1) is configured to receive a first clock signal (CK1), a bottom gate electrode of the first thin film transistor (T1) is connected to an adjustable voltage source (VLS), a source electrode of the first thin film transistor (T1) is connected to a signal G(n−1) of a (n−1)$^{th}$-stage GOA circuit unit, and a drain electrode of the first thin film transistor (T1) is connected to a gate electrode of the fourth thin film transistor (T4); wherein a gate electrode of the second thin film transistor (T2) is connected to a first node (Q), a source electrode of the second thin film transistor (T2) is connected to a drain electrode of the fifth thin film transistor (T5), a drain electrode of the second thin film transistor (T2) is configured to receive a second clock signal (CK2); wherein a gate electrode of the third thin film transistor (T3) is configured to receive a high voltage source (VGH), a drain electrode of the third thin film transistor (T3) is configured to receive the high voltage source (VGH), a source electrode of the third thin film transistor (T3) is connected to a drain electrode of the fourth thin film transistor (T4); wherein a source electrode of the fourth thin film transistor (T4) is configured to receive a low voltage source (VGL); wherein a gate electrode of the fifth thin film transistor (T5) is connected to a second node (Qb), a source electrode of the fifth thin film transistor (T5) is configured to receive the low voltage source (VGL); wherein an end of the capacitor (Cbt) is connected to the first node (Q), and another end of the capacitor (Cbt) is connected to an output signal G(n) of the nth-stage GOA circuit unit; a feedback compensation system disposed on upper and lower sides of the displaying region, the feedback compensation system connected to a chip on film package; wherein the feedback compensation system is configured to detect an electrical characteristic of the first thin film transistor (T1) in the GOA circuit and adjust a bottom gate voltage of the first thin film transistor (T1) according to variation of the electrical characteristic to recover the electrical characteristic of the first thin film transistor (T1); and a bus signal disposed on a side of the GOA circuit away from the displaying region, and connected to the feedback compensation system.

6. The display panel as claimed in claim 5, wherein
the feedback compensation system comprises a mirror circuit and a control module;
the mirror circuit comprises some of elements of the GOA circuit as follows:
the first thin film transistor (T1), the top gate electrode of the first thin film transistor (T1) connected to the first clock signal (CK1) or a data signal (Data), the bottom gate electrode of the first thin film transistor (T1) configured to receive an adjustable voltage source (VLS), the source electrode of the first thin film transistor (T1) connected to the high voltage source (VGH) or a scan signal (STV), and the drain electrode of the first thin film transistor (T1) connected to the first node (Q);
the gate electrode of the second thin film transistor (T2) connected to the first node (Q), the source electrode of the second thin film transistor (T2) connected to one end of the capacitor (Cbt), the drain electrode of the second thin film transistor (T2) configured to receive the second clock signal (CK2) or the low voltage source (VGL);
the other end of the second capacitor (Cbt) connected to the first node (Q); and
a sixth thin film transistor (T6), a gate electrode of the sixth thin film transistor (T6) connected to the high voltage source (VGH) or the low voltage source (VGL), a drain electrode of the sixth thin film transistor (T6) configured to receive a sense line of the control module, and a source electrode of the sixth thin film transistor (T6) connected to the first node (Q); and
the control module is integrated in a driver integrated circuit (IC) in the chip on film package.

7. The display panel as claimed in claim 6, wherein
the first clock signal (CK1), the second clock signal (CK2), and the scan signal (STV) are provided by an external timing controller.

8. The display panel as claimed in claim 6, wherein the first clock signal (CK1), the second clock signal (CK2), and the scan signal (STV) are combined, and correspond to a power-on status and a power-off status sequentially;
each of the power-on status and the power-off status comprises a stage S1 to a stage S3;
under the power-on status, a work status of the GOA circuit corresponds to the stage S1 to the stage S3:
in the stage S1, the first clock signal (CK1) and the signal G(n−1) of the (n−1)$^{th}$-stage GOA circuit unit are in a high potential, the first thin film transistor (T1), the second thin film transistor (T2), and the fourth thin film transistor (T4) are switched on;
in the stage S2, the first clock signal (CK1) and the signal G(n−1) of the (n−1)$^{th}$-stage GOA circuit unit are in a low potential, the first thin film transistor (T1) is switched off, and the second clock signal (CK2) increases from a low potential to a high potential;
in the stage S3, the first clock signal (CK1) is in a high potential and the signal G(n−1) of the (n−1)$^{th}$-stage GOA circuit unit is in a low potential, the first thin film transistor (T1) is switched on, the second clock signal (CK2) decreases from a high potential to a low potential, and the second thin film transistor (T2) is switched on;
under the power-on status, in the feedback compensation system, the top gate electrode of the first thin film transistor (T1) is connected to a first clock signal (CK1), the source electrode of the first thin film transistor (T1) is connected to the scan signal (STV), the drain electrode of the second thin film transistor (T2) is configured to receive a second clock signal (CK2), a gate electrode of the sixth thin film transistor (T6) is connected to the low voltage source (VGL);
and a work status of the feedback compensation system corresponds to the stage S1 to the stage S3 as follows:
in the stage S1, the first clock signal (CK1) and the scan signal (STV) are in a high potential, and the first thin film transistor (T1) and the second thin film transistor (T2) is switched on;
in the stage S2, the first clock signal (CK1) and the scan signal (STV) are in a low potential, the first thin film transistor (T1) is switched off, and the second clock signal (CK2) increases from a low potential to a high potential;
and in the stage S3, the first clock signal (CK1) is in a high potential, and the first thin film transistor (T1) is switched on.

9. The display panel as claimed in claim 8, wherein
under the power-off status, in the feedback compensation system, the top gate electrode of the first thin film transistor (T1) is connected to the data signal (Data), the source electrode of the first thin film transistor (T1) is connected to the high voltage source (VGH), the drain electrode of the second thin film transistor (T2) is configured to receive the low voltage source (VGL), the gate electrode of the sixth thin film transistor (T6) is connected to the high voltage source (VGH), and the sixth thin film transistor (T6) is switched on.

10. A threshold voltage compensating method for a thin film transistor, comprising: providing a display panel, wherein the display panel comprises: a displaying region and a non-displaying region, the non-displaying region comprising: a gate driver on array (GOA) circuit, the GOA circuit disposed near left and right sides of the displaying region, and the GOA circuit comprising a plurality of GOA circuit units that are cascaded, wherein n$^{th}$-stage GOA circuit unit comprises first to fifth thin film transistors (T1 to T5) and a capacitor (Cbt);
wherein the first thin film transistor (T1) is a dual-gate thin film transistor, a top gate electrode of the first thin film transistor (T1) is configured to receive a first clock signal (CK1), a bottom gate electrode of the first thin film transistor (T1) is connected to an adjustable voltage source (VLS), a source electrode of the first thin film transistor (T1) is connected to a signal G(n−1) of a (n−1)th-stage GOA circuit unit, and a drain electrode of the first thin film transistor (T1) is connected to a gate electrode of the fourth thin film transistor (T4);
wherein a gate electrode of the second thin film transistor (T2) is connected to a first node (Q), a source electrode of the second thin film transistor (T2) is connected to a drain electrode of the fifth thin film transistor (T5), a drain electrode of the second thin film transistor (T2) is configured to receive a second clock signal (CK2);
wherein a gate electrode of the third thin film transistor (T3) is configured to receive a high voltage source (VGH), a drain electrode of the third thin film transistor (T3) is configured to receive the high voltage source (VGH), a source electrode of the third thin film transistor (T3) is connected to a drain electrode of the fourth thin film transistor (T4);

wherein a source electrode of the fourth thin film transistor (T4) is configured to receive a low voltage source (VGL);

wherein a gate electrode of the fifth thin film transistor (T5) is connected to a second node (QB), a source electrode of the fifth thin film transistor (T5) is configured to receive the low voltage source (VGL);

wherein an end of the capacitor (Cbt) is connected to the first node (Q), and another end of the capacitor (Cbt) is connected to an output signal G(n) of the $n^{th}$-stage GOA circuit unit;

a feedback compensation system disposed on upper and lower sides of the displaying region, the feedback compensation system connected a chip on film package;

wherein the feedback compensation system is configured to detect an electrical characteristic of the first thin film transistor (T1) in the GOA circuit and adjust a bottom gate voltage of the first thin film transistor (T1) according to variation of the electrical characteristic to recover the electrical characteristic of the first thin film transistor (T1);

and a bus signal disposed on a side of the GOA circuit away from the displaying region, and connected to the feedback compensation system;

entering a power-on status of a combination of the first clock signal (CK1), the second clock signal (CK2), and the scan signal (STV), wherein under the power-on status, a work status of the GOA circuit corresponds to the stage S1 to the stage S3:

entering the stage S1, wherein the first clock signal (CK1) and the signal G(n−1) of the $(n-1)^{th}$-stage GOA circuit unit increase to a high potential, the first thin film transistor (T1) is switched on, the first node (Q) increases to a high potential, a storage capacitor (Cst) starts to charge, the second thin film transistor (T2) and the fourth thin film transistor (T4) are switched on, a width and a length of the fourth thin film transistor (T4) is far greater than those of the third thin film transistor (T3), the second node (QB) outputs a low potential, the output signal G(n) of the $n^{th}$-stage GOA circuit unit outputs a low potential;

entering the stage S2, wherein the first clock signal (CK1) and the signal G(n−1) of the $(n-1)^{th}$-stage GOA circuit unit is in a low potential, the first thin film transistor (T1) is switched off, the second clock signal (CK2) increases from a low potential to a high potential, and the output signal G(n) of the $n^{th}$-stage GOA circuit unit increases a high potential;

entering the stage S3, the first clock signal (CK1) is in a high potential and the signal G(n−1) of the $(n-1)^{th}$-stage GOA circuit unit is in a low potential, the first thin film transistor (T1) is switched on, the second clock signal (CK2) decreases from a high potential to a low potential, the second thin film transistor (T2) is switched on, the output signal G(n) of the $n^{th}$-stage GOA circuit unit decreases to a low potential, and the first node (Q) is coupled to a high potential;

under the power-on status, adjusting a connection status of the feedback compensation system, wherein the top gate electrode of the first thin film transistor (T1) is connected to a first clock signal (CK1), the source electrode of the first thin film transistor (T1) is connected to the scan signal (STV), the drain electrode of the second thin film transistor (T2) is configured to receive a second clock signal (CK2), and a gate electrode of the sixth thin film transistor (T6) is connected to the low voltage source (VGL);

adjusting an electrical characteristic of the feedback compensation system such that voltages of four ends of the first thin film transistor (T1) in the feedback compensation system are consistent with voltages of four ends of the first thin film transistor (T1) in the GOA circuit, wherein the step of adjusting are the stage S1 to the stage S3 as follows:

entering the stage S1, wherein the first clock signal (CK1) and the scan signal (STV) are in a high potential, the first thin film transistor (T1) and the second thin film transistor (T2) are switched on, the first node (Q) increases to a high potential, the storage capacitor (Cst) starts to charge;

entering the stage S2, wherein the first clock signal (CK1) and the scan signal (STV) are in a low potential, the first thin film transistor (T1) is switched off, the second clock signal (CK2) increases from a low potential to a high potential, the storage capacitor (Cst) starts to discharge, and the first node (Q) potential is coupled to a higher potential;

entering the stage S3, wherein the first clock signal (CK1) is a high potential, the first thin film transistor (T1) is switched on, a potential of the first node (Q) is coupled to a low potential;

entering a power-off status, adjusting the connection status of the feedback compensation system, wherein the top gate electrode of the first thin film transistor (T1) is connected to the data signal (Data), the source electrode of the first thin film transistor (T1) is connected to the high voltage source (VGH), the drain electrode of the second thin film transistor (T2) is connected to the low voltage source (VGL), and the gate electrode of the sixth thin film transistor (T6) is connected to the high voltage source (VGH);

detecting a sense line potential in the feedback compensation system by a control module, wherein the sense line potential is Vdata-Vth, Vdata indicates a voltage of the data signal (Data), Vth indicates a threshold voltage of the first thin film transistor (T1);

and adjusting the bottom gate voltage of the first thin film transistor (T1) for compensation of the Vth by using a shift value detected by the control module during a next booting of the display panel.

* * * * *